(12) United States Patent
Li

(10) Patent No.: US 9,735,735 B2
(45) Date of Patent: Aug. 15, 2017

(54) FRACTIONAL MIXER BASED TUNER AND TUNING METHOD

(71) Applicant: MONTAGE TECHNOLOGY (SHANGHAI) CO., LTD., Shanghai (CN)

(72) Inventor: Zhenbiao Li, Shanghai (CN)

(73) Assignee: MONTAGE TECHNOLOGY (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 15/146,892

(22) Filed: May 5, 2016

(65) Prior Publication Data

US 2016/0329865 A1 Nov. 10, 2016

(30) Foreign Application Priority Data

May 7, 2015 (CN) .......................... 2015 1 0230841
Jun. 8, 2015 (CN) .......................... 2015 1 0312098

(51) Int. Cl.
*G06G 7/42* (2006.01)
*H03D 7/14* (2006.01)
*H03F 3/45* (2006.01)
*H03D 7/16* (2006.01)

(52) U.S. Cl.
CPC ......... *H03D 7/1441* (2013.01); *H03D 7/1458* (2013.01); *H03D 7/165* (2013.01); *H03F 3/45475* (2013.01); *H03F 2203/45138* (2013.01); *H03F 2203/45288* (2013.01); *H03F 2203/45526* (2013.01); *H03F 2203/45616* (2013.01)

(58) Field of Classification Search
CPC .................. H03D 7/1441; H03F 3/45; H03F 2203/45288
See application file for complete search history.

(56) References Cited

U.S. PATENT DOCUMENTS 7,679,543 B2 * 3/2010 Park .......................... H03D 7/14
327/175
8,838,057 B2 * 9/2014 Pullela ................. H03D 7/1466
455/302

* cited by examiner

*Primary Examiner* — Kenneth B Wells
(74) *Attorney, Agent, or Firm* — Jun He Law Offices P.C.; James J. Zhu

(57) ABSTRACT

The application discloses a tuner and a method for tuning a signal. The tuner comprises: a sampling module, the sampling module being configured to receive an input signal and a set of control signals, sample the input signal under the control of the set of control signals and generate a sample signal; wherein each of the set of control signals has a control period equal to (N*$T_{VCO}$), and the control periods of the set of control signals synchronize with each other; a set of weighting modules, wherein each of the set of weighting modules is configured to receive the set of sample signals and weight the received sample signals with a group of weighting factors to generate a group of weighted signals; and one or more summing modules, each summing module being configured to receive one group of weighted signals generated by one of the set of weighting modules and sum the group of weighted signals to output an output signal, wherein the output signal is the input signal being shifted by a predefined frequency $f_{VCO}*m_k/N$.

24 Claims, 9 Drawing Sheets

FRACTIONAL MIXER BASED TUNER AND TUNING METHOD

CROSS REFERENCE TO RELATED APPLICATIONS

This application claims priority and benefits of Chinese Patent Application No. 201510230841.6 filed on May 7, 2015, and Chinese Patent Application No. 201510312098.9 filed on Jun. 8, 2015, the entire contents of which are incorporated herein by reference.

TECHNICAL FIELD

The application generally relates to integrated circuits and systems, and more particularly to a tuner and a method for tuning signals.

BACKGROUND

A mixer is an important block of radio frequency (RF) frontend circuits, and has been widely used in transceiver systems. The mixer is used to perform frequency shifting, i.e., to shift the carrier frequency of a desired signal from one frequency to another. For a transmitter, it shifts the desired signal from a low frequency band to a radio frequency band. This process is called up-mixing or up-conversion. For a receiver, it shifts a desired signal from a radio frequency band to a low frequency band. This process is called down-mixing or down-conversion.

The mixer generally performs signal mixing operations based on a local oscillating (LO) signal. In a direct conversion (DC) transceiver (TRX), for the down-conversion operation, the frequency of a received signal is the same as that of the LO signal, while in the up-conversion operation, the frequency of an output signal is the same as that of the LO signal. The LO signal is usually generated by dividing or multiplying the frequency of a voltage control oscillating (VCO) signal.

A tuner is generally used in electronic devices such as radios, TVs, etc., to select a desired channel from channels with different center frequencies. Thus, the tuner is equivalent to a down-mixer with an adjustable mixing frequency. In order to tune for channels of various frequencies, the frequency of a local clock is desired to be adjusted. It is generally desired to design different frequency dividers or frequency multipliers with relatively complicated circuit structures. In addition, when there is a frequency variation for the local clock, it may take a long time to stabilize the system, which is adverse to fast switching of channels.

Thus, there is a need to provide a signal tuner to resolve at least one of the aforesaid problems.

SUMMARY

An objective of the application is to use a fractional mixer in a tuner such that the tuner can tune to different frequencies with a single LO frequency.

In an aspect of the application, there is provided a tuner. The tuner comprises a sampling module comprising a set of sampling units, each sampling unit being configured to receive an input signal and a control signal, sample the input signal under the control of the control signal and generate a sample signal; wherein each of the set of control signals received by the set of sampling units has a control period equal to $(N*T_{VCO})$, and the control periods of the set of control signals synchronize with each other; a set of weighting modules coupled to the sampling module, each weighting module being configured to receive the set of sample signals and weight the received sample signals with a group of weighting factors to generate a group of weighted signals; and one or more summing modules, each summing module being configured to receive one group of weighted signals generated by one of the set of weighting modules and sum the group of weighted signals to output an output signal, wherein the output signal has a predefined frequency shift of $f_{VCO}*m_k/N$ compared with the input signal, and wherein $0<m_k<N/2$, k is the sequence number of the weighting modules and $f_{VCO}=1/T_{VCO}$.

In certain embodiments, the tuner further comprises a selection module configured to select one or more weighting modules from the set of weighting modules so as to provide one or more groups of weighted signals generated by the selected one or more weighting modules to the one or more summing modules.

In certain embodiments, the one or more summing modules comprises a summing module, and the tuner further comprises a selection module, and the selection module is configured to select one of the groups of weighted signals generated by the set of weighting modules and provide the selected group of weighted signals to the summing module.

In an aspect of the application, there is provided a method for tuning a signal. The method comprises receiving an input signal; sampling the input signal with a set of control signals to generate a set of sample signals, wherein each of the set of control signals has a control period equal to $(N*T_{VCO})$, and the control periods of the set of control signals synchronize with each other; weighting the set of sample signals with a set of groups of weighting factors to generate a set of groups of weighted signals; and summing one or more groups of the set of groups of weighted signals by group to output one or more tuned signals respectively, the output signal having a predefined frequency shift of $f_{VCO}*m_k/N$ compared with the input signal, wherein $0<m_k<N/2$, k is the group sequence number of the k-th group of weighting factors of the set of weighting factors and $f_{VCO}=1/T_{VCO}$.

The forgoing is an overview of the application where there may be simplification, summarization or omission of some details. Thus, a person skilled in the art should understand that the summary is merely illustrative and is not by any means in limitation of the scope of the application. The purpose of the summary is neither for determining the key features or essential features of the subjects seeking protection nor for determining the auxiliary means for the scope of the subjects seeks protection.

BRIEF DESCRIPTION OF THE DRAWINGS

The aforementioned features and other features of the present application will be further described in the following paragraphs by referring to the accompanying drawings and the appended claims. It will be understood that, these accompanying drawings merely illustrate certain embodiments in accordance with the present application and should not be considered as limitation to the scope of the present application. Unless otherwise specified, the accompanying drawings need not be proportional, and similar reference characters generally denote similar elements.

DETAILED DESCRIPTION OF THE PREFERRED EMBODIMENTS

The following detailed description refers to the accompanying drawings as a part of the present application. Unless otherwise stated in the context, similar symbols generally represent similar components in the accompanying figures. The illustrative embodiments described in the detailed description, the accompanying drawings and the claims are not limiting, and other embodiments may be adopted, or modifications may be made without deviating from the spirit and subject of the application. It should be understood that, the various aspects of the application described and graphically presented herein may be arranged, replaced, combined, divided and designed in many different configurations, and these different configurations are implicitly included in the application.

The inventor of the application has found that, in signal mixing, if there exists a frequency multiplication relationship or an approximate frequency multiplication relationship between the frequency of an input signal or of an output signal (i.e., an output signal generated from the mixing operation) and the frequency of a voltage controlled oscillator (VCO) signal, harmonic signals of one with a lower frequency of the two signals may easily intervene into the other signal with a higher frequency of the two signals, thereby interfering with the higher frequency signal. However, if in signal mixing processing, the frequency change between the input signal and the output signal (i.e., frequency shift) is set to a non-integer multiple, i.e., a fractional multiple, of the frequency of the VCO signal, then the frequencies of the harmonic signals of the signal with the lower frequency and the VCO signal may not overlap with each other. Thus, less harmonic interference may be introduced into the output signal. In some embodiments of the present application, some illustrative embodiments are provided to realize the aforesaid inventive concept.

Figure 1:
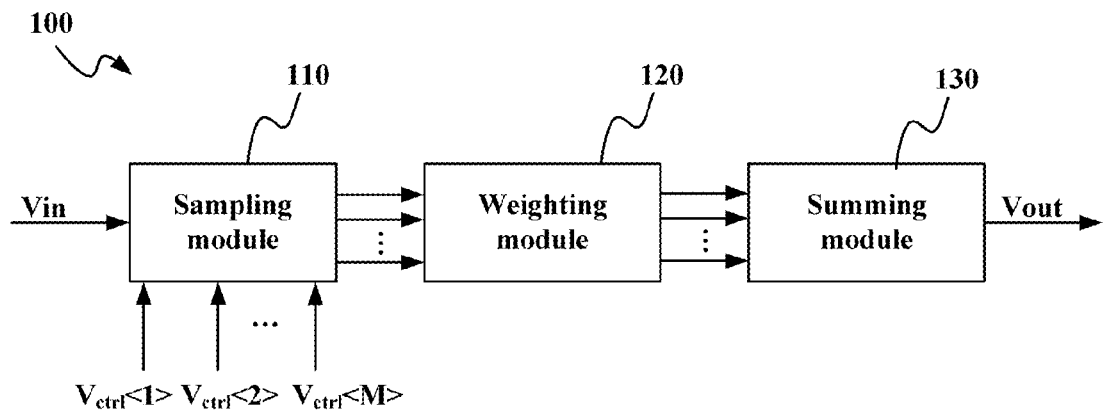
FIG. 1 shows a mixer 100 according to an embodiment of the application.

FIG. 1 shows a mixer 100 according to an embodiment of the application. The mixer 100 is used to receive an input signal $V_{in}$ and perform frequency shifting on the input signal $V_{in}$ to generate an output signal $V_{out}$. A frequency difference between the output signal $V_{out}$ and the input signal $V_{in}$ is the frequency shift produced by the mixer 100.

As shown in FIG. 1, the mixer 100 includes a weighting module 110, a switching module 120 and a summing module 130.

In particular, the weighting module 110 includes a set of sampling units (not shown). Each sampling unit receives an input signal $V_{in}$ and a control signal $V_{ctrl}\langle i \rangle$. Under the control of the control signal $V_{ctrl}\langle i \rangle$, each sampling unit samples the received input signal $V_{in}$ to generate a corresponding sample signal.

In particular, each control signal has a control period equal to $N^*T_{VCO}$, and the control periods of the control signals synchronize with each other. In other words, the start times and end times of the control periods of different control signals align with each other, respectively. In some embodiments, each control period includes N successive control intervals $T_n$ having an equal time period $T_{VCO}$. These control periods are successive in time. In particular, the N control intervals may be denoted successively as a first control interval $T_1$, a second control interval $T_2$, and so on. Since the control periods of the control signals align with each other, the control intervals of the control signals also align with each other. That is to say, in the same control period, the start times and the end times of the control intervals of different control signals with the same sequence number correspond to each other, respectively. Here, $T_{VCO}$ denotes the period of the VCO signal, and thus the frequency of the VCO signal is denoted as $f_{VCO}$ which is equal to $1/T_{VCO}$.

In some embodiments, a control signal may contain in one of the N control intervals a sampling enable waveform, such as a rectangle pulse, a sawtooth pulse, a step pulse, or other suitable enable waveforms which are suitable for controlling the corresponding sampling unit to sample the input signal $V_{in}$ during the entirety or a portion of the control period and output corresponding sample values. In some embodiments, the sampling enable waveform may include a set of discontinuous enable pulses. Preferably, N control signals may be provided, and each of the N control signal may contain a sampling enable waveform in each control period, which occupies the entirety or a portion of a control interval. Furthermore, the sampling enable pulses of different control signals do not overlap with each other such that different sampling units sample the input signal $V_{in}$ in respective control intervals.

In some embodiments, a control signal may have a set of sampling enable waveforms in a set of control intervals of the N control intervals, thereby controlling the corresponding sampling units to sample the input signal $V_{in}$ in the set of control intervals.

The weighting module 120 receives the set of sample signals generated by the sampling module 110 and weights the set of received sample signals with a set of weighting factors $\alpha_i$ to generate a set of weighted signals. In some embodiments, the weighting modules 120 includes a set of weighting units, and each weighting unit weights one of the set of sample signals with a predefined weighting factor $\alpha_i$. Different weighting units may have different weighting factors. Alternatively, different weighting units may also have the same weighting factor. In some embodiments, the weighting unit may be an amplifier such as a trans-conductive amplifier, a trans-impendence amplifier, etc. In some embodiments, the weighting unit may be a weighting resistor with a resistance value corresponding to the weighting factor. For example, the resistance value may be proportional to or inverse proportional to the weighting factor. The step of weighting the sample signal includes increasing or decreasing the amplitude of the sample signal and/or reversing the polarity of the sample signal, etc. In other words, the weighting factor $\alpha_i$ may be greater than 0 or less than 0, and the absolute value of $\alpha_i$ may be greater than, equal to 1 or less than 1. In addition, the weighting factor $\alpha_i$ may also be 0, which is equivalent to that the corresponding weighting unit does not output a signal or outputs a zero-valued signal, accordingly, the weighting unit and the corresponding sampling unit may be omitted when the weighting factor $\alpha_i$ is 0.

The summing module 130 receives the set of weighted signals generated by the weighting module 120 and sums the set of weighting signals to generate the output signal $V_{out}$. The output signal $V_{out}$ is has a predefined frequency shift $m/(N*T_{VCO})$ compared with the input signal $V_{in}$, where m is a predefined value relevant to the expected frequency shift.

In some embodiments, the weighted signals may be in current form, then summing of the weighted signals may be implemented in the summing module 130 by coupling the output nodes of the set of weighting units together. Similarly, if the weighted signals are in voltage form, then the summing module 130 may first convert the form of the set of weighted signals into current form and then sum the set of weighted signals by coupling the output nodes of the set of weighting units together to generate the summed signal. It will be appreciated by an artisan in this art that other ways may also be utilized to implement the summing of the set of weighted signals, which will not be elaborated here.

In some embodiments, in the n-th control interval $T_n$, the amplitude of the summed signal is $\beta_n$ times that of the input signal $V_{in}$, wherein $$\beta_n = A\cos\left(2\pi m \cdot \frac{n-1}{N} + \theta\right) + B \text{ or}$$

$$\beta_n = A\sin\left(2\pi m \cdot \frac{n-1}{N} + \theta\right) + B,$$

n=1, 2, . . . , N, and A, B and $\theta$ are all predefined real numbers. For example, in the n-th control interval $T_n$, the average amplitude of the summed signal is $\beta_n$ times that of the input signal $V_{in}$, or at corresponding moments of the n-th control interval $T_n$, the amplitude of the summed signal is $\beta_n$ times that of the input signal $V_{in}$.

In some embodiments, the summing module 130 may include a trans-impendence amplifier (TIA). In particular, the summing module 130 may include a set of input paths. Each input path receives a weighted signal. The weighted signals received by the input paths are collected at the input nodes of the TIA such that the weighted signals are summed at the input nodes of the summing module 130. In this way, the TIA may amplify and convert the form of the summed signal. In particular, the form of the signal is converted from current form into voltage form, thereby the output signal $V_{out}$ is generated in voltage form at the output nodes of the TIA. It will be appreciated that, in some other embodiments, based on the form of the summed weighted signal, the summing module 130 may also be implemented by other types of amplifiers or signal buffers, such as trans-conductance amplifiers.

Generally, the sample signals generated by the sampling module 110 are discontinuous signals which contain certain high frequency components. These signals, after being weighted by the weighting module 120 and summed by the summing module 130, may still be discontinuous. It means that, for certain moment, if the moment is within a sampling interval (i.e., a control interval which contains a sampling enable pulse) for a sampling unit, then the value of the summed signal is equal to that of the expected output signal at the moment. Otherwise, the value of the summed signal is 0. Thus, the summed signal contains the expected output signal $V_{out}$. Moreover, the summed signal also contains high order harmonics of the output signal $V_{out}$.

The summed signal is generally an analog signal. In order to process the output signal $V_{out}$ in digital domain, it is required to perform analog-to-digital conversion for the output signal $V_{out}$ in analog form, to generate a corresponding digital signal. The analog to digital conversion may be implemented by an analog-to-digital convertor (ADC) which, for example, may be coupled to post-stages of the summing module 130. Due to the limitation of device characteristics, the dynamic range of the signals input to the ADC should meet certain requirements. An input signal with an excessive large amplitude will lead to ADC saturation and further lead to distortion of the digital signals generated by the ADC, while an input signal with an excessive small amplitude will lead to a small effective number of bits (ENOB) and a low signal-to-noise-ratio (SNR). Thus, a variable gain amplifier (VGA) may be used to adjust the amplitude of the output signal $V_{out}$ inputted to the ADC by setting the gain of the VGA, such that the amplitude of the signal inputted to the ADC can be maintained within a proper range. A digital signal processor (DSP) is coupled to the post-stages of the ADC, and is used to process the digital signal generated by the ADC. The DSP may be implemented by FPGA, ASIC, general processors or combinations thereof. For a discontinuous summed signal, the sampling rate and the sampling time of the ADC can be selected such that the sampling time of the ADC is within the sampling interval of the control signal, then the digital signal generated may be a digital signal corresponding to the output signal $V_{out}$.

In some embodiments, the summing module 130 further includes a filter for filtering the summed signal, thereby to filter out signals out of the frequency range of the output signal $V_{out}$, such as high order harmonics. By making a pass band of the filter contain the bandwidth of the expected output signal and making the signal out of the bandwidth of the expected output signal substantially attenuated, the expected output signal can be generated with the out-of-band signal suppressed. The filtered signal is a continuous signal and the sampling time of the ADC may be selected according to actual needs, as long as the sampling theory is satisfied. In this way, the requirement of synchronization between the sampling time of the ADC and the control signal is thus avoided.

The relationship between the summed signal $V_{sum}$ generated by the summing module 130 and the input signal $V_{sum}$ may be given by Equation (1) as follows $$V_{sum}(t) = V_{in}(t) \cdot \sum_j \sum_{n=1}^{N} \beta_n p(t - (n-1+Nj) \cdot T_{VC0}) \quad (1)$$

where $V_{in}(t)$ is the input signal, $V_{sum}(t)$ is the summed signal, $\beta_n$ is a frequency conversion coefficient which denotes the ratio between the amplitude of the summed signal $V_{sum}(t)$ and the input signal $V_{in}(t)$ in the n-th control interval $T_n$, p(t) denotes a sampling waveform function which corresponds to the sampling enable waveform. Sampling enable waveforms of the sampling control interval are the same. In some embodiments, the sampling enable waveform may be an enable pulse, and accordingly, the sampling waveform function p(t) may be a pulse function which is non-zero during time period [0, Tp) and is zero in other time periods. Herein, $T_p$ denotes the pulse width of p(t), $0 < T_p \le T_{VCO}$. The summed signal substantially contains the input signal $V_{in}$ with a frequency shift $f_{VCO}*m/N$.

In some embodiments, the set of frequency conversion coefficients $\beta_n$ may be given by Equation (2) as follows $$\beta_n = A \cdot \cos\left(2\pi \cdot m \cdot \frac{n-1}{N} + \theta\right) + B \quad (2)$$

where m is a predefined real number, and $\theta$ denotes an initial phase which may be selected from a range [0, $2\pi$) according to actual needs, the parameter A denotes an amplitude parameter used to obtain frequency conversion coefficients of reasonable precision. The parameter A may be a positive number or a negative number. The parameter B denotes a direct current (DC) adjustment parameter, which can be set to 0, for example.

As compared to the input signal $V_{in}$, the output signal $V_{out}$ is a result of the input signal $V_{in}$ being shifted by the predefined frequency m/(N*$T_{VCO}$), where 0<m<N/2. Herein, N and m may be set based on fractional multiples of frequency as actually needed. For example, if it is needed to set the frequency difference between the output signal $V_{out}$ and the input signal $V_{in}$ to be 5/(16$T_{VCO}$), then N is set to 16 and m is set to 5.

When the mixer 100 is used in down-conversion, the frequency of a signal inputted to the mixer 100 is substantially equal to $f_{VCO}$*m/N or $f_{VCO}$*m/N plus a relatively small frequency. After being processed by the mixer 100, the output signal $V_{out}$ generated by the mixer 100 is a baseband signal or a low intermediate frequency (IF) signal. Since there is no frequency multiplication relationship between the frequency $f_{VCO}$*m/N of the input signal and the VCO frequency, it is more flexible to select the VCO frequency. It may be appreciated that the mixer 100 may also be used in up-conversion. The principle of the mixer 100 used in up-conversion may be similar to that of the down-conversion, which is not elaborated here.

The structure and operation of the mixer according to the present application will be further illustrated below with reference to detailed circuit embodiments.

Figure 2:
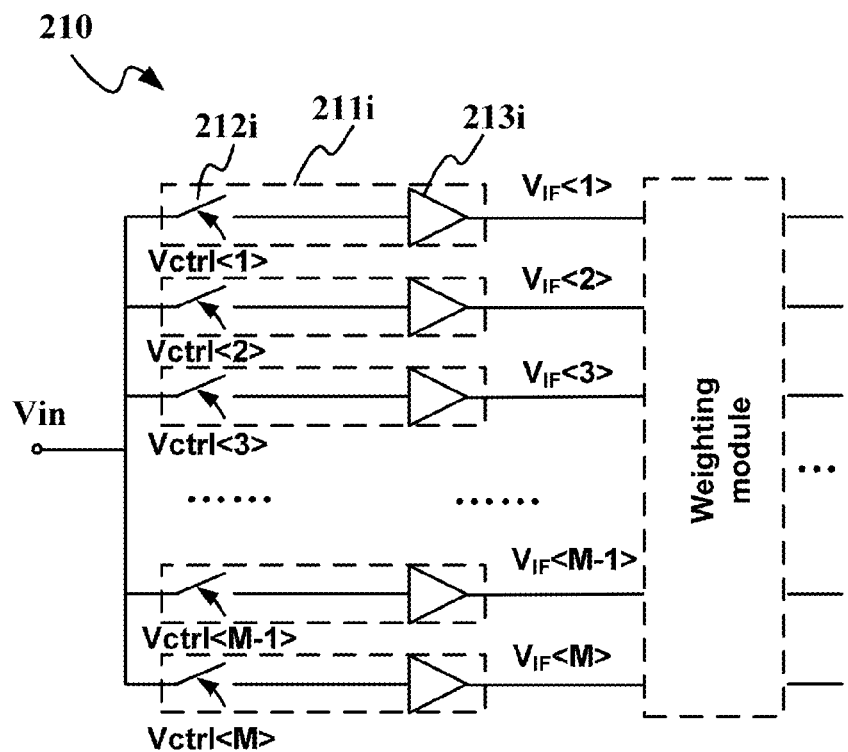
FIG. 2 shows an exemplary circuit of the sampling module shown in FIG. 1.

FIG. 2 shows an exemplary circuit of the sampling module of the mixer in FIG. 1.

As shown in FIG. 2, the sampling module 210 includes a set of sampling units 211$i$. Input nodes of the sampling units 211$i$ are coupled together for receiving the input signal $V_{in}$. Moreover, each sampling unit 211$i$ further receives a control signal $V_{ctrl}$<i>. For example, each sampling unit 211$i$ includes a sampling switch 212$i$ which samples the input signal $V_{in}$ under the control of the control signal received to generate a corresponding sample signal $V_{IF}$<i>. In some embodiments, the sampling switch 212$i$ may be an MOS switch, a CMOS switch or other types of switches. The control signal $V_{ctrl}$<i> may control the conducting state of the corresponding sampling switch 212$i$, to allow or prohibit passage of the input signal $V_{in}$. The input signal passing through the sampling switch 212$i$ constitutes the sample signal generated by the sampling unit 211$i$. Alternatively, each sampling unit 211$i$ may further include a buffer 213$i$ for improving its driving capability. In FIG. 2, $V_{ctrl}$<i> denotes the i-th control signal, and $V_{IF}$<i> denotes the i-th sample signal. Similar notations for denoting signals will be used below unless otherwise specified.

It should be noted that the signals (including the input signal $V_{in}$ and the sample signals $V_{IF}$) shown in FIG. 2 may be either single-ended signals or differential signals. When the signals are differential signals, the sampling switch 212$i$ of each sampling unit 211$i$ may include a pair of switching devices. The control signal $V_{ctrl}$ received by the sampling unit 211$i$ synchronously controls the pair of switching devices to sample the differential input signal $V_{in}$. Similarly, the buffer 213$i$ includes a pair of buffering devices which is coupled to the outputs of the pair of switching devices. In short, the tuner may be of a single ended structure, or alternatively, the tuner may be of a differential structure. In the following, the tuner of the present application is exemplarily described with examples where the tuner is of a differential structure. However, such example is not intended to be a limitation.

Figure 3:
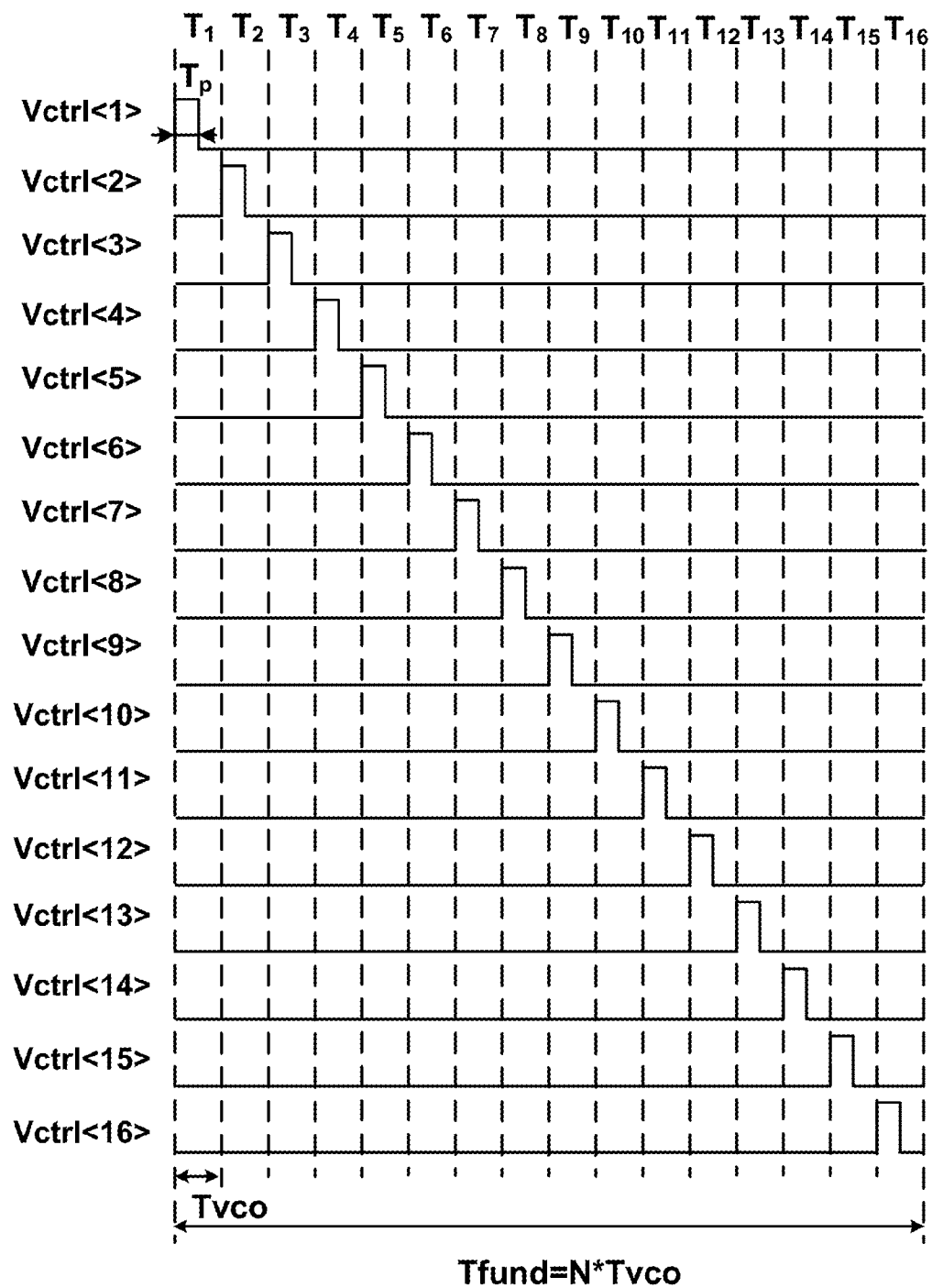
FIG. 3 shows an example of a set of control signals according to an embodiment of the application.

FIG. 3 shows exemplary control signals according to an embodiment of the application.

As shown in FIG. 3, each of the control signals ($V_{ctrl}$<1>, $V_{ctrl}$<2>, ..., $V_{ctrl}$<16>) has a control period with a length $T_{fund}$=N*$T_{VCO}$. The embodiment shown in FIG. 3 takes N=16 as an example and shows 16 control signals. The control periods of the control signals are synchronized with each other. As an example, only one control period is shown in the Figure, and the waveforms of the control signals may periodically repeat at the control period $T_{fund}$.

In particular, each control period includes N control intervals each having a length $T_{VCO}$, i.e., the first control interval $T_1$, the second control interval $T_2$, and so on. Each control interval includes a sampling enable waveform which is, for example, a rectangle pulse with a pulse width $T_P$. In addition, the n-th control signal does not contain any sampling enable pulse in the control intervals other than the n-th control interval, i.e., the corresponding sampling unit does not sample the input signal in those control intervals. It should be noted that, although the sampling enable pulses shown in FIG. 3 are rectangle pulses, it may be appreciated that the sampling enable pulse may be any other suitable waveforms, as long as such waveforms can control the corresponding sampling unit to sample the input signal in the sampling control interval.

Figure 4:
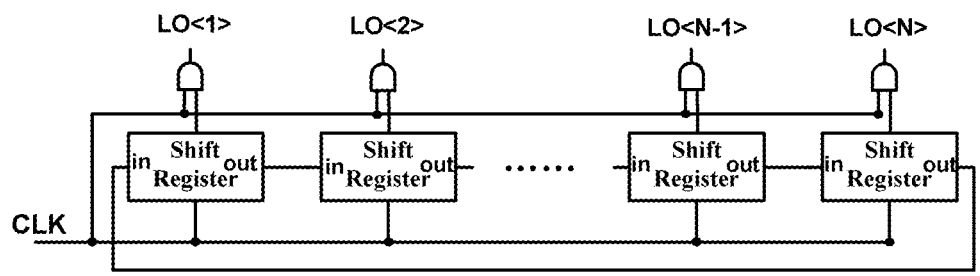
FIG. 4 shows an exemplary circuit of N-stage shift registers for generating a set of control signals shown in FIG. 3.

The control signals shown in FIG. 3 may be generated by a circuit with N-stage shift registers shown in FIG. 4. The signal CLK is a rectangle clock signal with a frequency $f_{VCO}$.

Figure 5:
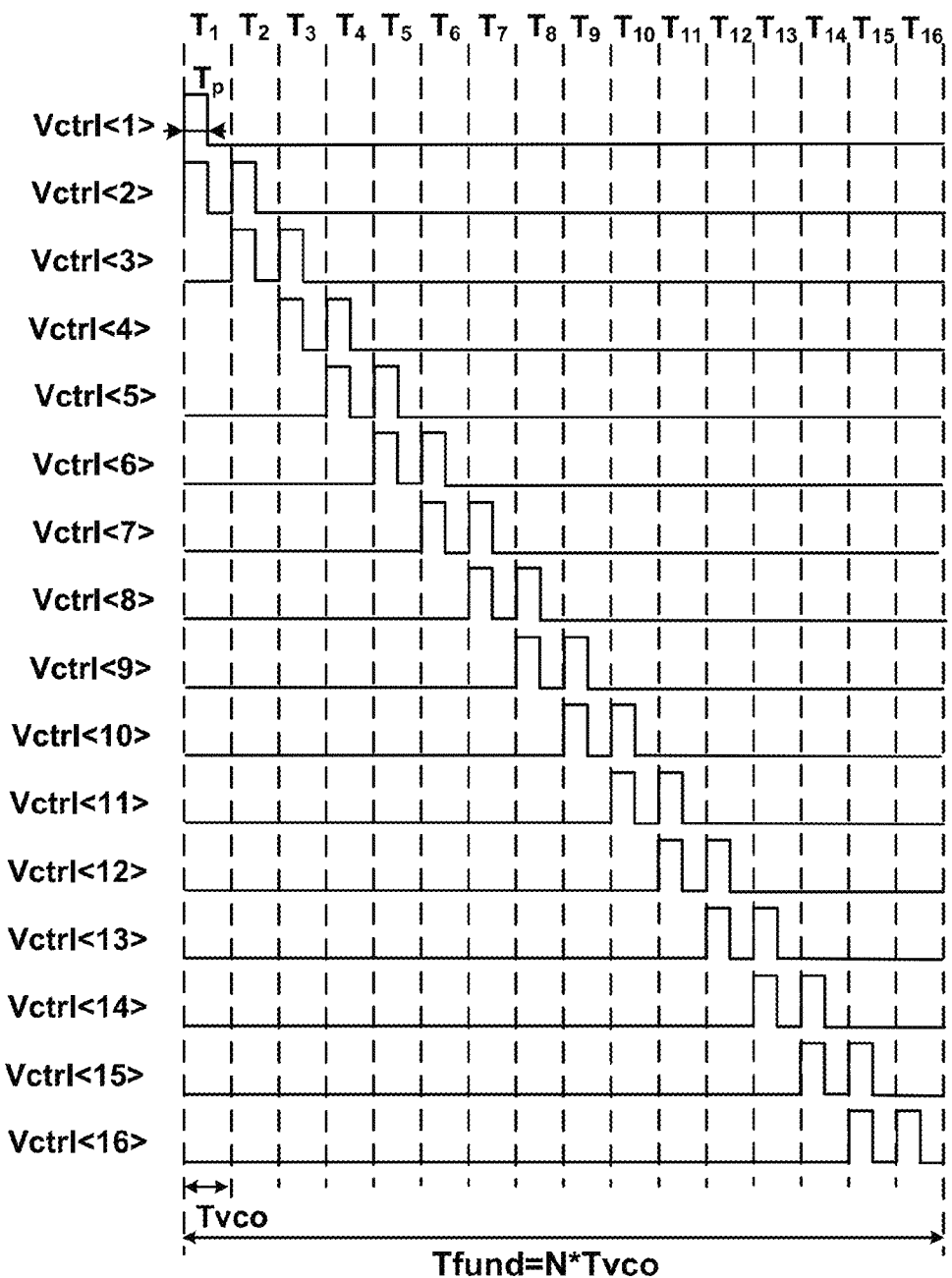
FIG. 5 shows another example of the set of control signals according to an embodiment of the application.

As stated above, in some embodiments, within a single control period, one or more control signals may contain two or more sampling enable waveforms at different control intervals. FIG. 5 shows an example where all of the control signals except the first one contains two sampling enable waveforms. These control signals that contain two sampling enable waveforms can be generated by the control signals shown in FIG. 3 with additional logic OR gates. Accordingly, each control interval other than the 16-th control interval $T_{16}$ contains two sampling enable pulses to control two respective sampling units to sample the input signal and generate two corresponding sample values.

Figure 6:
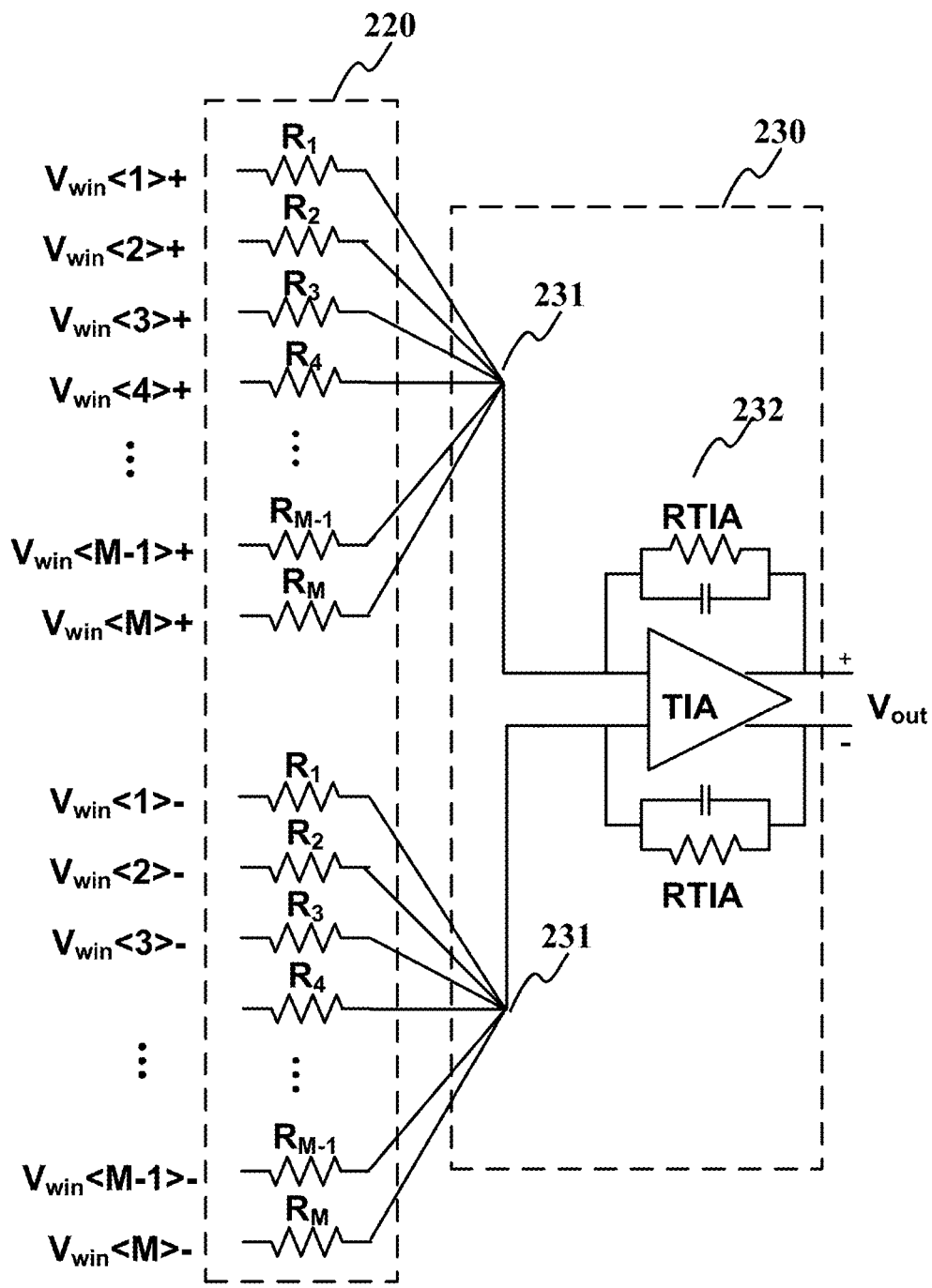
FIG. 6 shows an exemplary circuit of the weighting module and the summing module of the mixer shown in FIG. 1.

FIG. 6 shows an exemplary circuit of the summing module shown in FIG. 1. As shown in FIG. 6, the weighting module 220 is used to weight the differential sample signals to generate differential weighted signals. The summing module 230 is used to sum the differential weighted signals to generate the differential summed signal.

In particular, the weighting module 220 receives a set of differential sampling signals as its input signals. Each sampling signal $V_{IF}$<i> includes a differential signal with positive component $V_{IF}$<i>+ and negative component $V_{IF}$<i>−. The weighting module 220 includes a set of weighting units. Each weighting unit includes a pair of weighting resistors with the same resistance value, which weight the positive and the negative components received by the weighting unit, respectively. In particular, the resistance value of the weighting resistors in the weighting unit is inverse proportional to the weighting factor of the weighting unit. In other words, the larger the weighting factor of the weighting unit is, the smaller the resistance value of the weighting resistor is.

In particular, the i-th weighting unit of weighting module 220 shown in FIG. 6 includes a pair of weighted signal input nodes for receiving the sample signal generated by the corresponding i-th sampling unit (not shown). The pair of input nodes of the i-th weighting unit for receiving the weighted signals are called as positive weighted signal input node $V_{win}<i>+$ and negative weighted signal input node $V_{win}<i>-$, respectively. In addition, the i-th weighted unit includes a pair of weighting resistors with the same resistance which are called positive weighting resistor and negative weighting resistor respectively. The pair of weighting resistors are used to weight the sample signal components received at the positive weighted signal input node $V_{win}<i>+$ and the negative weighted signal input node $V_{win}<i>-$, respectively. If the weighting factor of the weighting unit is greater than 0, then the positive signal input node and the negative signal input node respectively receive the positive component and the negative component of the sample signal generated by the corresponding sampling unit, i.e., $V_{win}<i>+=V_{IF}<i>+$, $V_{win}<i>-=V_{IF}<i>-$. On the contrary, if the weighting factor is less than 0, then the positive signal input node and the negative signal input node respectively receive the negative component and the positive component of the sample signal generated by the corresponding sampling unit, i.e., $V_{win}<i>+=V_{IF}<i>-$, $V_{win}<i>-=V_{IF}<i>+$. Moreover, if the weighting factor is equal to 0, which is equivalent that the resistor value of the weighting resistor is very large (substantially equivalent to open-circuited), then the pair of signal input nodes of the weighting unit may be coupled to any pair of output nodes of the corresponding sampling unit. Preferably, when the weighting factor of a weighting unit is equal to 0, the weighting unit and the corresponding sampling unit may be omitted.

It should be noted that, although the weighting module and the summing module shown in FIG. 6 processes differential signals, a person skilled in the art may appreciate that variations may be made to the circuit shown in FIG. 6 to make it suitable for processing single-ended signals. For example, when the signal is single-ended, each weighting unit may include only one weighting resistor. When the weighting factor is a positive value, the sampling unit may be connected to the corresponding weighting unit. When the weighting factor is a negative value, the corresponding weighting unit also includes an inverter, which is used to invert the sample signal that has not been weighted or the weighted signal that has been weighted.

It should also be noted that, although the weighted unit shown in FIG. 6 implements the signal weighting using a pair of (or a weighting resistor, for a single-ended signal) weighting resistors, in applications, any other devices or circuits that can amplify or scale a signal may be used. For example, a current amplifier formed by a current mirror may be used to perform weighting operation.

In some embodiments, for the weighting units shown in FIG. 6 implemented by weighting resistors, if the resistance values of two or more weighting units are equal to each other and there is no overlap in time between the sample enabling waves of the control signal received by the sampling units coupled to the two or more weighting units, then the two or more sampling units may be combined into a single weighting unit, i.e., the weighting units are multiplexed in time. Thus, the hardware cost can be reduced. For example, the output nodes of the two or more sampling units may be coupled to each other, and the input nodes of the weighting unit may be coupled to the output nodes of the two or more sampling units.

In some embodiments, weighting a sample signal may also be implemented by two or more weighting units. For example, if the weighting factor of a weighting unit is $\lambda$, then $\lambda$ may be obtained by summing two or more numbers, such as $\lambda=\lambda_1+\lambda_2$. In this way, the function of the weighting unit with weighting factor $\lambda$ may be implemented by two weighting units, one of which has a weighting factor $\lambda_1$ and the other has a weighting factor $\lambda_2$. In this case, the number of corresponding sampling units may also be two or more, depending on the number of weighting factors.

In the weighting module 220, selection of weighting factors for the weighting units are relevant to the number of weighting units, the form of control signals and the frequency shift $f_{VCO}*m/N$ shifted by the mixer. Specifically, if the distribution of sampling enable waveforms of a set of periodic control signals is represented by a sampling control matrix $$C = \begin{bmatrix} c_{11} & c_{12} & \cdots & c_{1,M} \\ c_{21} & c_{22} & \cdots & c_{2,M} \\ \vdots & \vdots & c_{i,j} & \vdots \\ c_{N,1} & \cdots & \cdots & c_{N,M} \end{bmatrix},$$

where $c_{i,j}$ denotes a sampling indicator of the j-th control signal in the i-th sampling control interval, $c_{i,j}=1$ if the i-th sampling control interval includes a sampling enable waveform, and otherwise $c_{i,j}=0$. If the weighting factors are represented by a weighting factor vector $\alpha_k=[\alpha_{k,1}, \alpha_{k,2}, \ldots, \alpha_{k,M}]^T$, wherein $\alpha_{k,i}$ is the i-th weighting factor, then the selected weighting factors should satisfy the following equation $$C\alpha_k=\beta_k \quad (3)$$

where $\beta$ denotes a vector $\beta=[\beta_1, \beta_2, \ldots, \beta_N]^T$ constituted by the mixing transformation coefficient $\beta_n$.

The number of weighting units included in the weighting module M may be greater than or equal to the number of control intervals N within a control period. Generally, unless the corresponding mixing transformation coefficient $\beta_n$ during certain control interval(s) is equal to 0 or approximate to 0, i.e., the amplitude of the output signal is 0 or approximates 0 during the control intervals, the number of weighting units M cannot be less than the number of control intervals N within a control period. When the frequency shifting parameter m of the mixer is given, the mixing transformation coefficient $\beta_n$ can be calculated respectively for n=1, 2, ..., N from equation (2) and the vector $\beta=[\beta_1, \beta_2, \ldots, \beta_N]^T$ can be constructed. Based on whether the control signal corresponding to each sampling unit includes a sampling enable waveform within each control interval, the sampling control matrix C can be constructed. After constructing C and $\beta$, the weighting factor vector $\alpha$ may be obtained by solving the equation (3), so that the weighting factor vectors of the weighting units can be determined.

Preferably, the number of weighting units M may be selected to be equal to the number of intervals N within a control period. When there exists a mixing transformation coefficient equal to 0, the number of weighting units M may be selected to be equal to the number of non-zero mixing transformation coefficients. In this case, M is less than N. In this manner, the number of weighting units and the number of corresponding sampling units is minimized.

Preferably, when the number of weighting units M is equal to the number of control intervals, the control signals may be configured such that the corresponding control matrix is an identity matrix, i.e. $C=I_N$, wherein $I_N$ denotes an identity matrix of order N whose size is N*N, its diagonal elements are equal to 1 and its off-diagonal elements are equal to 0. In this case, the weighting factor vector α is equal to the mixing transformation vector β. This configuration corresponds to the control signals shown in FIG. 3, i.e., for each control signal, there is only one control interval which includes the sampling enable waveform and there is only one control signal which includes the sampling enable waveform within the single control interval.

Alternatively, the control signals may also be configured such that the corresponding control matrix C is an invertible non-diagonal matrix. In this case, the weighting factor vector $\alpha=C^{-1}\beta$, wherein $C^{-1}$ denotes the inversion of matrix C. For the control signal shown in FIG. 5, the corresponding sampling control matrix C is given by:

$$C = \begin{bmatrix} 1 & & & \\ 1 & 1 & & \\ & \ddots & \ddots & \\ & & 1 & 1 \end{bmatrix}_{N \times N}.$$

In some examples, for the purpose of easier implementation, the weighting factor $\alpha_i$ calculated by equation (3) may be quantized to a value, for example, an integer value, which is easy to be implemented. The quantization method may be determined according to practical requirements to tradeoff between complexity and performance. For example, the quantization operation may be a convert-to-integer operation which may include down conversion (i.e., the converted value is the maximum integer not greater than the value to be converted), up conversion (i.e., the converted value is the minimum integer not less than the value to be converted), rounded conversion (i.e., the converted value is an integer closest to the value to be converted), or other convert-to-integer operations based on practical requirements. For example, in order to reduce the complexity in implementation of hardware, the converted value is a value closest to the value to be converted, which can be expressed as a sum of several integer powers of 2. In some embodiments, the quantization operation may not be the convert-to-integer operation. For example, the quantized value may be a fractional number which is easy to be implemented. In the example where the weighting factors are implemented by weighting resistors, the ratio of resistance of the weighting resistors may be integer or fractional.

When the weighting factor vector α is equal to the mixing transformation vector β, the value of the amplitude A may be properly chosen to tradeoff between quantization precision and circuit complexity. In addition, as to the initial phase θ, theoretically it can be any value between 0 and 2π. However, in order to reduce the number of weighting units and circuit complexity, an appropriate initial phase θ may be chosen to obtain as many zero-value weighting coefficients as possible, or to obtain as many weighting coefficients with the same value or absolute value as possible. In this way, the number of weighting units and the cost in hardware can be reduced.

It should be noted that the embodiment described above is illustrated by taking the input signal $V_{in}$ as a real signal. If the input signal $V_{in}$ is a complex signal, then its in-phase component $V_{in\_}I$ and quadrature component $V_{in\_}Q$ should be mixed by the mixer described above, respectively, to generate the in-phase component $V_{out\_}I$ and the quadrature component $V_{out\_}Q$ of the output signal. Except for the specific values of the weighting gains and the mixing transform coefficients, the same structure may be used for a mixer that receives in-phase component of the input signal and another mixer that receives quadrature component of the input signal. The mixing transformation coefficient of the mixer that receives the in-phase component $V_{in\_}I$ of the input signal is given by $$\beta_{n,I} = A \cdot \cos\left(2\pi \cdot m \cdot \frac{n-1}{N} + \theta\right) + B \qquad (4)$$

The mixing transformation coefficient of the mixer that receives the quadrature component $V_{in\_}Q$ of the input signal is given by $$\beta_{n,Q} = A \cdot \sin\left(2\pi \cdot m \cdot \frac{n-1}{N} + \theta\right) + B \qquad (5)$$

The set of weighting factors of the corresponding mixer may be calculated from equation (3).

Table 1 illustrates that mixing transformation coefficients $\beta_n$ are calculated for different values of m when N=16, wherein parameters B and θ are both set to 0. Moreover, in consideration of quantization precision and complexity in circuit implementation, parameter A is set to 28 and the calculation results are rounded to keep one decimal. The abbreviation "Inp" in Table 1 indicates that the results are calculated from function $$A\cos\left(2\pi m \cdot \frac{n-1}{N} + \theta\right) + B,$$

and the abbreviation "Quad" indicates that the results are calculated from function $$A\sin\left(2\pi m \cdot \frac{n-1}{N} + \theta\right) + B.$$

It should be noted that although Table 1 illustrates the case where the parameter m is an integer, however, in other embodiments, the parameter m is not limited to integers. Actually, the parameter m may be chosen to be any real number satisfying 0<m<N/2 based on actual requirement.

TABLE 1

| m | n | 1 | 2 | 3 | 4 | 5 | 6 | 7 | 8 | 9 | 10 | 11 | 12 | 13 | 14 | 15 | 16 |
|---|---|---|---|---|---|---|---|---|---|---|----|----|----|----|----|----|----|
| 1 | Inp | 28.0 | 25.9 | 19.8 | 10.7 | 0.0 | −10.7 | −19.8 | −25.9 | −28.0 | −25.9 | −19.8 | −10.7 | 0.0 | 10.7 | 19.8 | 25.9 |
|   | Quad | 0.0 | 10.7 | 19.8 | 25.9 | 28.0 | 25.9 | 19.8 | 10.7 | 0.0 | −10.7 | −19.8 | −25.9 | −28.0 | −25.9 | −19.8 | −10.7 |

TABLE 1-continued

| m | n | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|---|
| 2 | Inp | 28.0 | 19.8 | 0.0 | -19.8 | -28.0 | -19.8 | 0.0 | 19.8 | 28.0 | 19.8 | 0.0 | -19.8 | -28.0 | -19.8 | 0.0 | 19.8 |
|   | Quad | 0.0 | 19.8 | 28.0 | 19.8 | 0.0 | -19.8 | -28.0 | -19.8 | 0.0 | 19.8 | 28.0 | 19.8 | 0.0 | -19.8 | -28.0 | -19.8 |
| 3 | Inp | 28.0 | 10.7 | -19.8 | -25.9 | 0.0 | 25.9 | 19.8 | -10.7 | -28.0 | -10.7 | 19.8 | 25.9 | 0.0 | -25.9 | -19.8 | 10.7 |
|   | Quad | 0.0 | 25.9 | 19.8 | -10.7 | -28.0 | -10.7 | 19.8 | 25.9 | 0.0 | -25.9 | -19.8 | 10.7 | 28.0 | 10.7 | -19.8 | -25.9 |
| 4 | Inp | 28.0 | 0.0 | -28.0 | 0.0 | 28.0 | 0.0 | -28.0 | 0.0 | 28.0 | 0.0 | -28.0 | 0.0 | 28.0 | 0.0 | -28.0 | 0.0 |
|   | Quad | 0.0 | 28.0 | 0.0 | -28.0 | 0.0 | 28.0 | 0.0 | -28.0 | 0.0 | 28.0 | 0.0 | -28.0 | 0.0 | 28.0 | 0.0 | -28.0 |
| 5 | Inp | 28.0 | -10.7 | -19.8 | 25.9 | 0.0 | -25.9 | 19.8 | 10.7 | -28.0 | 10.7 | 19.8 | -25.9 | 0.0 | 25.9 | -19.8 | -10.7 |
|   | Quad | 0.0 | 25.9 | -19.8 | -10.7 | 28.0 | -10.7 | -19.8 | 25.9 | 0.0 | -25.9 | 19.8 | 10.7 | -28.0 | 10.7 | 19.8 | -25.9 |
| 6 | Inp | 28.0 | -19.8 | 0.0 | 19.8 | -28.0 | 19.8 | 0.0 | -19.8 | 28.0 | -19.8 | 0.0 | 19.8 | -28.0 | 19.8 | 0.0 | -19.8 |
|   | Quad | 0.0 | 19.8 | -28.0 | 19.8 | 0.0 | -19.8 | 28.0 | -19.8 | 0.0 | 19.8 | -28.0 | 19.8 | 0.0 | -19.8 | 28.0 | -19.8 |
| 7 | Inp | 28.0 | -25.9 | 19.8 | -10.7 | 0.0 | 10.7 | -19.8 | 25.9 | -28.0 | 25.9 | -19.8 | 10.7 | 0.0 | -10.7 | 19.8 | -25.9 |
|   | Quad | 0.0 | 10.7 | -19.8 | 25.9 | -28.0 | 25.9 | -19.8 | 10.7 | 0.0 | -10.7 | 19.8 | -25.9 | 28.0 | -25.9 | 19.8 | -10.7 |

The mixer 100 shown in FIG. 1 may be used for mixing the real input signal $V_{in}$. In this case, the mixing transformation coefficient $\beta_n$ may be calculated from the function $$A\cos\left(2\pi m \cdot \frac{n-1}{N} + \theta\right) + B$$

(corresponding to the "Inp" parameters in Table 1), or calculated from the function $$A\sin\left(2\pi m \cdot \frac{n-1}{N} + \theta\right) + B$$

(corresponding to the "Quad" parameters in Table 1). It will be readily appreciated by an artisan in the art that, when the input signal $V_{in}$ is a complex signal, the mixer 100 illustrated in FIG. 1 may be used to process an in-phase component and a quadrature component of the complex signal, respectively, to generate the output signal. Accordingly, the mixing transformation coefficients $\beta_n$ corresponding to the in-phase branch may be calculated from the function $$A\cos\left(2\pi m \cdot \frac{n-1}{N} + \theta\right) + B,$$

and the mixing transformation coefficients $\beta_n$ corresponding to the quadrature component may be calculated from the function $$A\sin\left(2\pi m \cdot \frac{n-1}{N} + \theta\right) + B.$$

As shown in FIG. 6, the summing module 230 includes a trans-impendence amplifier (TIA) 232. The TIA 232 is configured such that the set of weighted signals generated by the set of weighting units are summed at its input terminal and the output signal is generated in voltage form. In FIG. 6, the input terminal of the TIA 232 is a summing node 231 which couples the output terminals of various weighting units together to sum the set of weighted signals generated by the weighting module. Thus, the summed signal $V_{sum}$ can be generated. The summed signal $V_{sum}$ contains the expected output signal $V_{out}$. For a differential signal, coupling the output terminals of various weighting units together refers to coupling the output terminals of positive components of the weighting units together and coupling the output terminals of positive components of the weighting units together, as is shown in FIG. 6.

It should be noted that the output terminals of the various weighting units can be directly coupled together only if there is no cross talk between the various weighting units after their output terminals being coupled together. If there is crosstalk between the various weighting units after their output terminals being coupled together, the output terminals of the various weighting units cannot be directly coupled to the summing node 231. Instead, a signal buffering unit should be coupled to each output terminal of the weighting units before the output terminals of the weighting units being coupled together. The signal buffering unit may prevent crosstalk between signals generated from the weighting module to the summing node 231.

In some embodiments, the summing module 230 also includes a filter for filtering the summed signal. The filter can filter out signals which is out of the frequency range of the output signal. The expected output signal can be generated by properly setting the parameter of pass band and stop band of the filter, such that signals out of the expected bandwidth of the output signal can be filtered. The filter parameters that satisfy the requirements can be readily obtained for an artisan skilled in the art by employing conventional filter design methods, which will not elaborated here. In some embodiments, the filter 232 may be coupled into the feedback path of the TIA 232 as shown in FIG. 6. In other embodiments, the filter may be implemented by a single element which is placed at a post stage of the TIA.

The operation of the mixer 100 shown in FIG. 1 during a control period will be illustrated by taking an example where m=5, N=16 and the control signals are similar to those shown in FIG. 3. An artisan skilled in the art will readily appreciate examples for other values of m and N according to such example.

If m=5 and N=16, then the set of mixing transformation coefficients of the weighting units 120 are equal to the in-phase or quadrature parameters for m=5 in Table 1, for example, equal to the in-phase coefficients, respectively. In addition, since the control signals shown in FIG. 3 are used, as stated above, the weighting factors of the weighting units are equal to the corresponding mixing transformation coefficients, respectively. In Table 1, since there are 14 non-zero in-phase parameters for m=5, at least 14 weighting units are required, and the weighting units with the weighting factor equal to 0 and their corresponding sampling units may be omitted.

During a control interval $T_1$, under the control of a sampling enable waveform of the control signal $V_{ctrl}<1>$, the sampling switch of the sampling unit that receives the control signal $V_{ctrl}<1>$ samples the input signal $V_{in}(t)$. The weighting unit with a weighting factor $\beta_1=28.0$ receives the sample signal and weights the sample signal, thereby generating a weighted signal $V_{in}(t)=\beta_1 V_{in}(t)=28.0 V_{in}(t)$. For other sampling units, since there is no sampling enable waveform within the control interval $T_1$, the signals generated by the corresponding weighting units are equal to 0. At this time, the summed signal $V_{sum}(t)$ generated by the summing module 130 is given by $V_{sum}(t)=V_w(t)=28 V_{in}(t)$. During a control interval $T_2$, the weighting unit coupled to the sampling unit that receives the control signal $V_{ctrl}<2>$ outputs a weighted signal $V_{in}(t)=\beta_2 V_{in}(t)=-10.7 V_{in}(t)$. Accordingly, the summed signal $V_{sum}(t)$ generated by the summing module 130 is given by $V_{sum}(t)=V_w(t)=-10.7 V_{in}(t)$. Similarly, during a control interval $T_3$, the weighting unit coupled to the sampling unit that receives the control signal $V_{ctrl}<3>$ outputs a weighted signal $Vw(t)=\beta_3 V_{in}(t)=-19.8 Vin(t)$. Accordingly, the summed signal generated by the summing module 130 is $V_{sum}(t)=V_w(t)=-19.8 V_{in}(t)$. The summed signal generated during other control intervals can be generated in a similar manner. The summed signals generated in different control intervals of a complete control period together constitutes a simulation or analogy to the input signal with a frequency shift.

Figure 7:
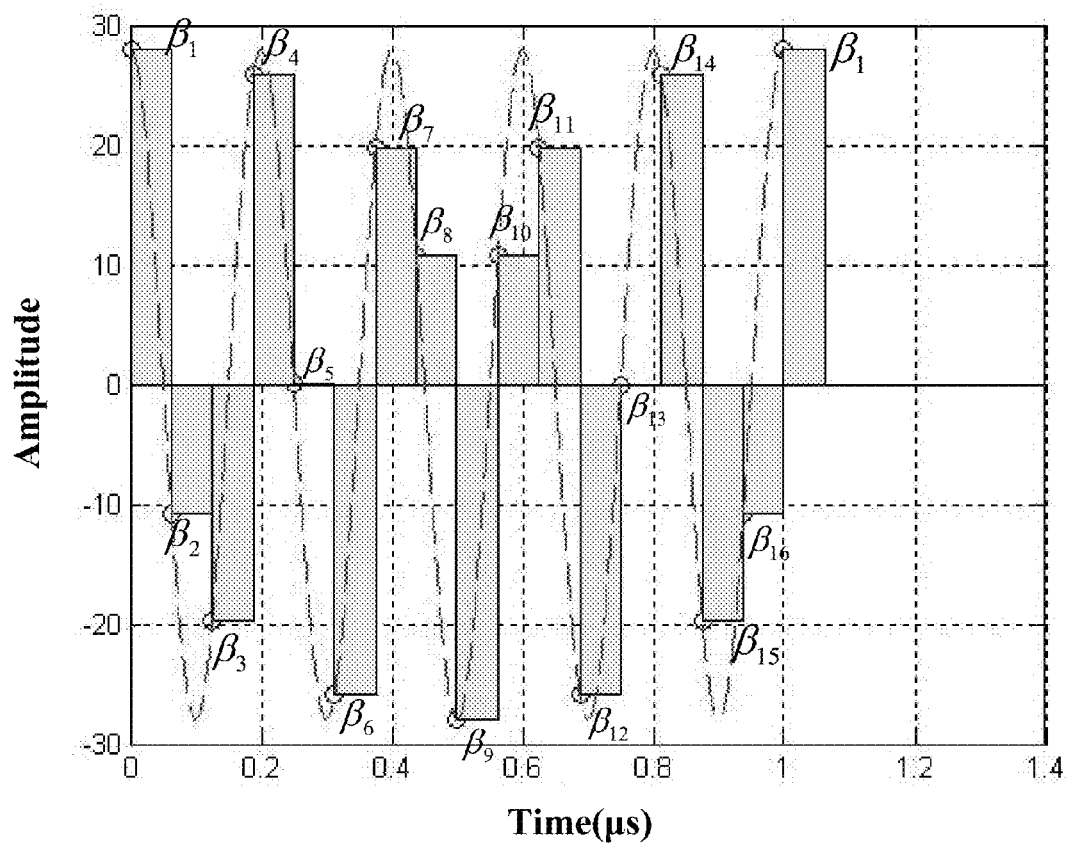
FIG. 7 shows a waveform of a weighting signal according to an embodiment of the application.

FIG. 7 illustrates the waveform of a weighting signal $$V_p(t) = \sum_j \sum_{n=1}^{16} \beta_n p(t - (n-1+16j) \cdot T_{VCO})$$

determined by the relationship between the mixing transformation coefficient $\beta_n$ and time when m=5, N=16, $T_{VCO}=\frac{1}{16}$ μs and $T_p=T_{VCO}$, wherein the pulse function is equal to 1 during the interval [0, $T_{VCO}$) and is equal to 0 during other time intervals. The summed signal $V_{sum}(t)$ generated by the summing module is in substance a result of the input signal $V_{in}(t)$ multiplying with the weighted signal waveform $V_p(t)$, i.e., $V_{sum}(t)=V_{in}(t)*V_p(t)$. The summed signal $V_{sum}(t)$ contains the output signal $V_{out}(t)$.

Figure 8:
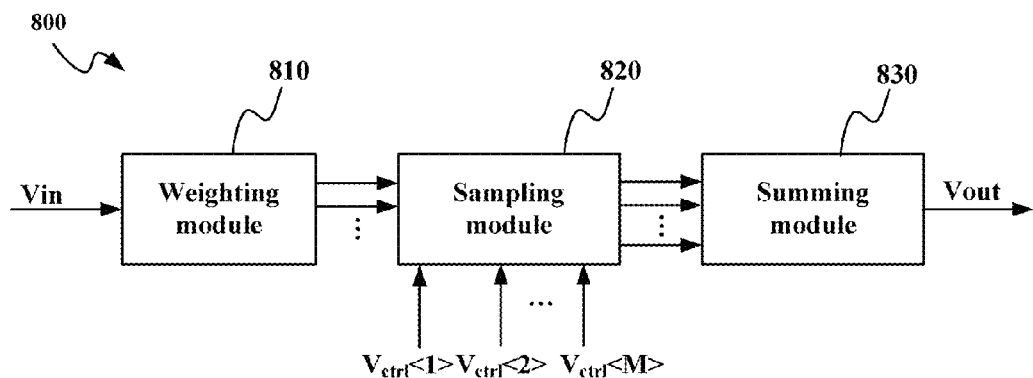
FIG. 8 shows a mixer 800 according to an embodiment of the application.

It can be understood that, in other embodiments, the connection between the modules of the mixer shown in FIG. 1 may be modified. For example, the weighting module may be coupled in front of the sampling module, and then the input signal can be pre-weighted with various weighting factors and the resulting weighted signals can be sampled and summed. FIG. 8 illustrates a diagram of a mixer 800 according to another embodiment of the application.

As illustrated in FIG. 8, the mixer 800 includes a weighting module 810 configured to receive an input signal and weight the input signal with a set of weighting factors to generate a set of weighted signals. The mixer 800 also includes a sampling module 820 which includes a set of sampling units. Each sampling unit is configured to receive one of a set of sampling signals and a control signal, sample the weighted signal under the control of the control signal and generate a sample signal. Each of the set of control signals received by the set of sampling units has a control period equal to ($N*T_{VCO}$), and the control periods of the set of control signals synchronize with each other. The mixer 800 also includes a summing module 830 configured to receive the set of sample signals generated, sum the set of the sample signals and output an output signal. The output signal has a predefined frequency shift of $f_{VCO}*m/N$ compared with the input signal, wherein 0<m<N/2, and $f_{VCO}=1/T_{VCO}$.

The detailed circuit schematic and operation of the mixer 800 may be referred to the corresponding description of the mixer described in the previous embodiments and will be omitted herein.

It can be seen from the description of the mixer of this application that, the mixer of the application, different from a conventional mixer, can achieve different frequency shifts by using a single local clock frequency. Thus, the mixer of this application can be used in a tuner application.

A conventional tuner is typically used in electronic devices, such as a radio set, a TV set, etc., to select a desirable channel from channels with different central frequencies. Thus, the tuner is generally equivalent to a down mixer with adjustable mixing frequencies. The frequency of the local clock needs to be changed in order to tune to different channels, which generally requires a complex circuit with different frequency dividers or multipliers. Moreover, it takes a long time for stabilizing the local clock frequency when it is changed, which is adverse to the speed of channel switching. However, quick channel switching can be achieved by using the tuner disclosed in this application, instead of changing the local clock frequency.

Figure 9:
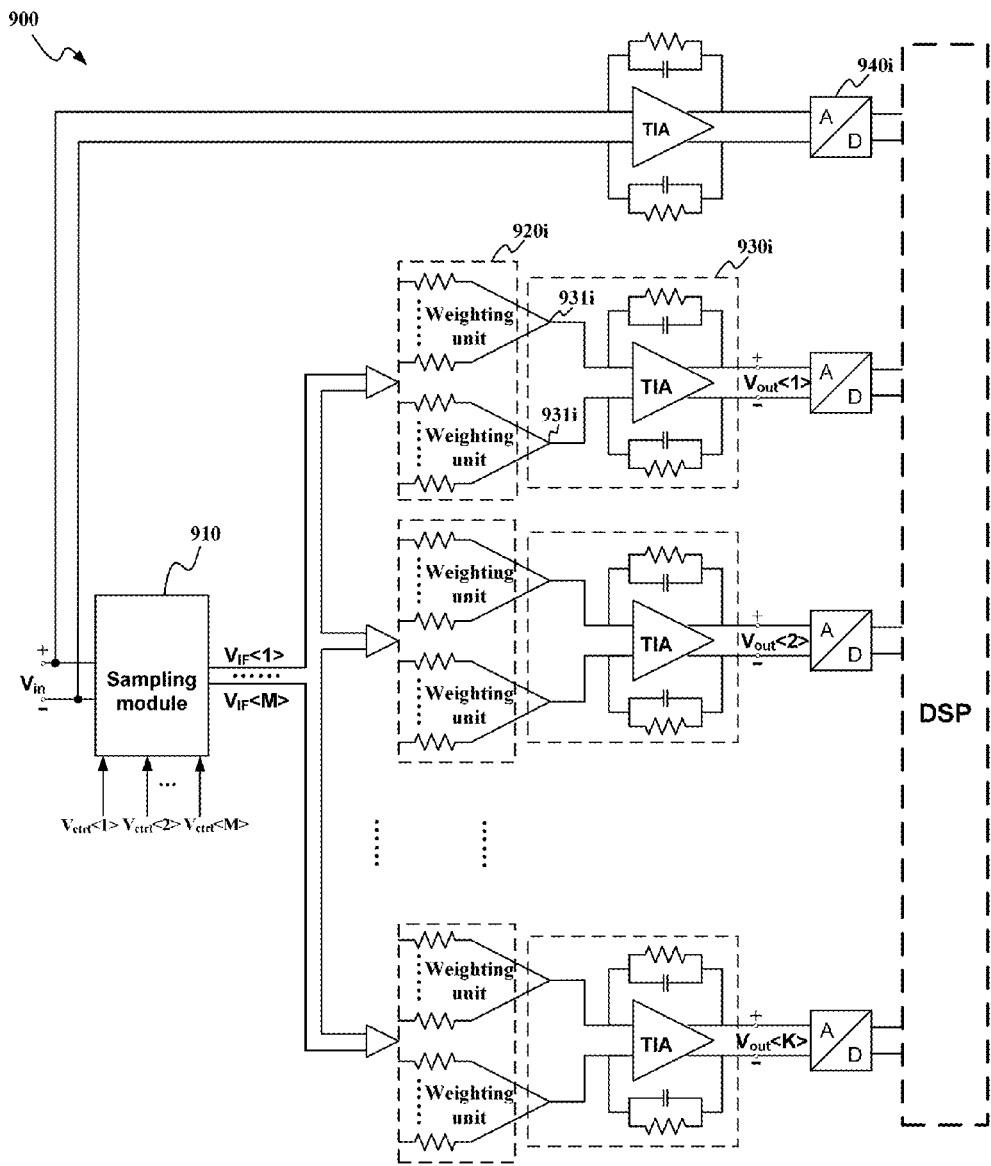
FIG. 9 shows a tuner 900 according to an embodiment of the application.

FIG. 9 illustrates a tuner 900 according to an embodiment of the application.

As shown in FIG. 9, the tuner 900 includes a sampling module 910, a set of weighting modules 920i and a set of summing modules 930i.

The sampling module 910 is used to receive an input signal $V_{in}$ and a set of control signals $V_{ctrl}$, and sample the input signal $V_{in}$ under the control of the set of control signals, thereby to generate a set of sample signals. Each control signal has a control period equal to ($N*T_{VCO}$), and the control periods of the set of control signals synchronize with each other. The sampling module 910 may be implemented either by the sampling module 210 shown in FIG. 2 or other sampling modules capable of performing the same function. The operations performed by the control signals $V_{ctrl}$ to control the sampling control module may be referred to the sampling modules described in previous embodiments and will not be elaborated herein. Moreover, in the embodiment shown in FIG. 9, the turner 900 is illustrated as including one sampling module 910. In applications, however, the tuner 900 may also include a set of sampling modules, for example, each sampling module provides a set of sample signals to a corresponding weighting module 920i.

In FIG. 9, the number of weighting modules 920i may be more than one. Each weighting module 920i is configured to receive the set of sample signals generated by the sampling module and weight the received sample signals with a group of weighting factors to generate a group of weighted signals. In particular, each weighting module 920i may include a group of weighting units. Each weighting unit weights one of the set of sample signals with a predefined weighting factor. Each weighting module 920i may be implemented by the weighting module 220 illustrated in FIG. 6 and the weighting factors of weighting units of different weighting modules may be different. The operation of various weighting units may be referred to the aforementioned embodiments of the application and will be omitted herein. The parameter setting for different weighting units will be illustrated below.

In FIG. 9, the number of summing modules 930i may be more than one. Each summing module 930i is fixedly coupled to one of the set of weighting modules 920i to receive the group of weighted signals generated by the weighting module coupled thereto, and sum the group of weighted signals received, thereby generating the output signal. The output signal has a predefined frequency shift $m_k/(N*T_{VCO})$ compared with the input signal, wherein $0<m_k<N/2$, k is the sequence number of the set of weighting modules. Each weighting module 920i corresponds to a parameter $m_k$. In other words, different tuned signals are generated when the signals generated by the weighting modules 920i are summed by the summing modules 930i, respectively. Each summing module 930i may be implemented by the summing module 230 shown in FIG. 6. The operation of the summing modules may be referred to the aforementioned corresponding description and is omitted herein.

When the sampled control signals $V_{ctrl}$ for a weighting module 920i is given, the weighting factor of each weighting unit determines the frequency shift of the output signal relative to the input signal, which can be obtained by summing the weighted signals generated by the weighting units. In this way, when the frequency shift is given (i.e., the parameter $m_k$ is given), the above method for determining the weighting factors for various weighting units of the mixer may be used to determine the weighting factors of various weighting units of the weighting module 920i, and determine the corresponding sample signals received at various input terminals of the weighting module. Detailed operations may be referred to the previous description and are omitted.

In some embodiments, each summing module 930i also includes a filter configured to filter out signals that are out of the frequency band of the output signal generated by the summing module 930i. The filters are configured as low pass filters with real coefficients. Cut-off frequencies of the filters may be set based on the frequency characteristics of the wideband TV signals to be processed. The filters are used to filter the summed signals and generate the baseband signals of corresponding channels/bands.

The operation of the tuner 900 is illustrated below in detail with reference to an example where the input signal is a TV signal.

The input signal $V_{in}$ generally includes a set of signals of different channels/bands. The bandwidths of these signals normally are the same, and the signals of each channel is modulated to a central frequency of the corresponding channel/band. The interval between the central frequencies of two adjacent channels is usually greater than the bandwidth of each channel/band.

Table 2 illustrates a channel configuration of a wideband TV signal. The TV signal includes 8 frequency bands (bands 0-7) in total. The bandwidth of each band is 120 MHz. Each band may include multiple TV channels. The interval between the central frequencies of two adjacent channels is 120 MHz. The signal of each frequency band includes an in-phase component and a quadrature component. For purpose of simplicity, only the processing of the in-phase or the quadrature component is described below unless otherwise specified. The processing of the other component is similar. Details of the operation can be referred to the foregoing paragraphs.

TABLE 2

| | Frequency Band | | | | | | | |
|---|---|---|---|---|---|---|---|---|
| | 0 | 1 | 2 | 3 | 4 | 5 | 6 | 7 |
| Central Frequency (MHz) | 0 | 120 | 240 | 360 | 480 | 600 | 720 | 840 |

As shown in FIG. 9, the sampling module 910 of the tuner 900 receives the input signal $V_{in}$ and a set of control signals $V_{ctrl}$. In this example, the input signal $V_{in}$ is a wideband TV signal. The set of control signals are respectively denoted as $V_{ctrl}<1>, V_{ctrl}<2>, \ldots, V_{ctrl}<M>$. Waveforms of the control signal may be selected from the waveforms illustrated in FIG. 3, FIG. 5 or other waveforms satisfying the required conditions. Under the control of the set of control signals, the input signal $V_{in}$ is sampled to generate a set of sample signals $V_{IF}<1>, V_{IF}<2>, \ldots, V_{IF}<M>$. The sampling module 910 includes a set of sampling units. Each sampling unit receives the input signal $V_{in}$ and one of the control signals $V_{ctrl}<i>$, and generates a sample signal $V_{IF}<i>$ under the control of the received control signal.

Each weighting module 920i receives the set of sample signals and weights each of the sample signals with a group of weighting factors to generate a group of weighted signals. Each weighting module 920i may be implemented by the weighting module 220 shown in FIG. 6. Each weighting module 920i includes a group of weighting units. Each weighting unit weights the sample signal $V_{IF}<i>$ with a predefined weighting factor $\alpha_{k,i}$ to generate a resulting weighted signal.

Each summing unit 930i is coupled to a weighting module 920i, to receive a group of weighted signals generated by the weighting module 920i, and sums the group of weighted signals to generate a resulting tuned signal. For purpose of simplicity, assuming that the k-th summing unit 930i is coupled to the k-th weighting module 920i and the resulting tuned signal is denoted as $V_{out}<k>$. The output signal has a predefined frequency shift of $f_{VCO}*m_k/N$ compared with the input signal, wherein $m_k$ is a predefined value. In this example, $f_{VCO}=1920$ MHz, N=16, $m_k=k$, and k=1, 2, ..., 7. In other words, the tuner 900 moves the frequencies of the TV signals to the baseband, respectively.

By properly setting the weighting factors of the k-th weighting module, the corresponding mixing transform coefficient of the n-th control interval $T_n$ of the control signals can be chosen to be $\beta_{k,n}$, wherein when the inputted signal is the in-phase component of the input signal, $$\beta_{k,n} = A\cos\left(2\pi m_k \cdot \frac{n-1}{N} + \theta\right) + B;$$

when the inputted signal is the quadrature component of the input signal, $$\beta_{k,n} = A\sin\left(2\pi m_k \cdot \frac{n-1}{N} + \theta\right) + B,$$

n=1, 2, ..., N, parameters A, B and θ are all predefined real numbers. If the set of weighting factors of the k-th weighting module are denoted as a weighting factor vector $\alpha_k=[\alpha_{k,1}, \alpha_{k,2}, \ldots, \alpha_{k,M}]^T$, wherein $\alpha_{k,i}$ is the i-th weighting factor, then the set of weighting factors of the k-th weighting module should satisfy the following equation $$C\alpha_k = \beta_k \quad (6)$$

wherein C is a sampling control matrix corresponding to the control signals $V_{ctrl}$, $\beta_k$ is a vector $\beta_k=[\beta_{k,1}, \beta_{k,2}, \ldots, \beta_{k,N}]^T$ formulated by the mixing transformation coefficient $\beta_{k,n}$. It should be noted that, the selected control signals $V_{ctrl}$ should ensure solvability of the above equation.

By utilizing the tuner 900 and configuring the weighting factors of the tuner 900 according to the above method, the signals of bands 1 to 7 of the wideband TV signals can be detuned from the input signal.

Each of the output signals may be sampled by an analog to digital convertor (ADC) to generate a digital signal and then the resulting digital signal is processed by a digital signal processor (DSP). The bandwidth of the ADC should correspond to the bandwidth of the output signal. For example, for a band with 120 MHz bandwidth, an ADC with a bandwidth above 60 MHz should be used. The wideband digital signal sampled by the ADC includes a set of TV channels. The DSP may select a portion or all of the channels in this band for processing. In this manner, multiple digital channels may be demodulated simultaneously. This method not only achieves high efficiency but also has a simple structure.

If the input signal includes a band with zero central frequency (such as band 0 in Table 2), then no weighting module or summing module is required to process the signal of this band. Instead, a trans-impendence amplifier is used to directly convert the input signal into voltage form. In addition, a low pass filter may be used to filter the input signal, thereby to generate the signal of the required band.

Figure 10:
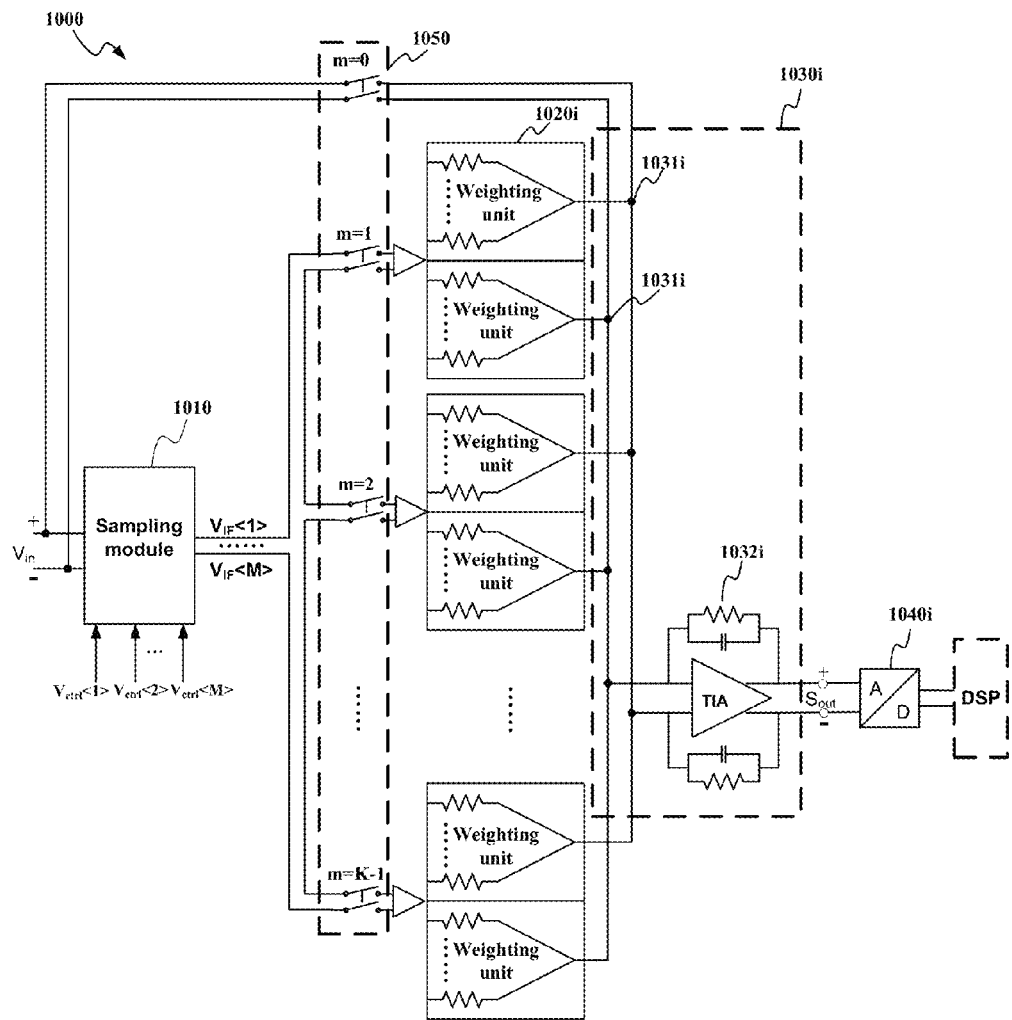
FIG. 10 shows a tuner 1000 according to an embodiment of the application.

FIG. 10 illustrates a schematic diagram of a tuner 1000 according to the application.

Similar to the tuner 900 shown in FIG. 9, the tuner 1000 shown in FIG. 10 includes a sampling module 1010 and a set of weighting modules 1020$i$. However, the tuner 1000 shown in FIG. 10 includes only one summing module 1030$i$. The sampling module 1010 is the same as the sampling module 910$i$ of the tuner 900. The structure of each weighting module 1020$i$ is substantially the same as each weighting module 920$i$ of the tuner 900. The tuner 1000 and the tuner 900 have the following differences. For the tuner 900, the number of the summing module 930$i$ is equal to the number of the weighting modules 920$i$, and each summing module 930$i$ is coupled to a weighting module 920$i$. For the tuner 1000, a single summing module 1030$i$ is coupled to all the weighting modules 1020$i$, i.e., the summing module can sum the weighted signals generated by all the weighting modules 1020$i$. It can be understood that, in other embodiments, the tuner 1000 may include multiple summing modules and the number of the summing modules is less than or equal to the number of the weighting modules.

In order to selectively couple different weighting modules 1020$i$ with the summing module 1030$i$, the tuner 1000 also includes a selecting module 1050 configured to select at least one group of weighted signals generated by the set of weighting module 1020$i$, and provide them to the summing module 1030$i$. In FIG. 10, the selecting module 1050 may select one of the weighting modules 1020 and couple it to a summing module 1030$i$. It can be understood that, when there are a set of summing modules 1030$i$ in the tuner, the selecting module 1050 may select a corresponding number of weighting modules 1020$i$, and couple them to the set of summing module 1030$i$, wherein each summing module 1030$i$ receives a group of weighted signals generated by one of the weighting modules 1020$i$.

When there is only one summing module, the selecting module may be coupled between the sampling module and the weighting module as shown in FIG. 10. The selecting module may also be coupled between the summing node and output node of the summing module. The selecting module may also be coupled between the weighting module and the summing module, so that the summing module receives the set of weighted signals generated by the selected weighting modules. When there are a set of summing modules, the selecting module may be coupled either between the summing node 1031$i$ and the output node of the summing module, or between the weighting module and the summing module, so that each of the summing modules receives the set of weighted signals generated by the selected one of the weighting modules. In actual applications, the selecting module may receive a frequency selection signal and control the coupling between the weighting modules 1020$i$ and the summing modules 1030$i$ according to the frequency selection signal.

In some embodiments of the application, there is provided a signal mixing method. These signal mixing methods may be implemented by the mixer 100 shown in FIG. 1 or the mixer 800 shown in FIG. 8.

In an aspect of the application, there is provided a signal mixing method, including: receiving an input signal; weighting the input signal with a set of weighting factors to generate a set of weighted signals; sampling the set of weighted signals by a set of control signals to generate a set of sample signals, wherein each of the set of control signals has a control period equal to ($N*T_{VCO}$) and the control periods of the set of control signals synchronize with each other; and summing the sample signals to generate an output signal, wherein the output signal has a predefined frequency shift of $f_{VCO}*m/N$ compared with the input signal, wherein 0<m<N/2, $f_{VCO}=1/T_{VCO}$.

In an aspect of the application, there is further provided a signal mixing method, including: receiving an input signal; sampling the input signal by a set of control signals to generate a set of sample signals, wherein each of the set of control signals has a control period equal to ($N*T_{VCO}$) and the control periods of the set of control signals synchronize with each other; weights the set of sample signals with a set of weighting factors to generate a set of weighted signals; and summing the weighted signals to generate an output signal, wherein the output signal has a predefined frequency shift of $f_{VCO}*m/N$ compared with the input signal, wherein 0<m<N/2, $f_{VCO}=1/T_{VCO}$.

Figure 11:
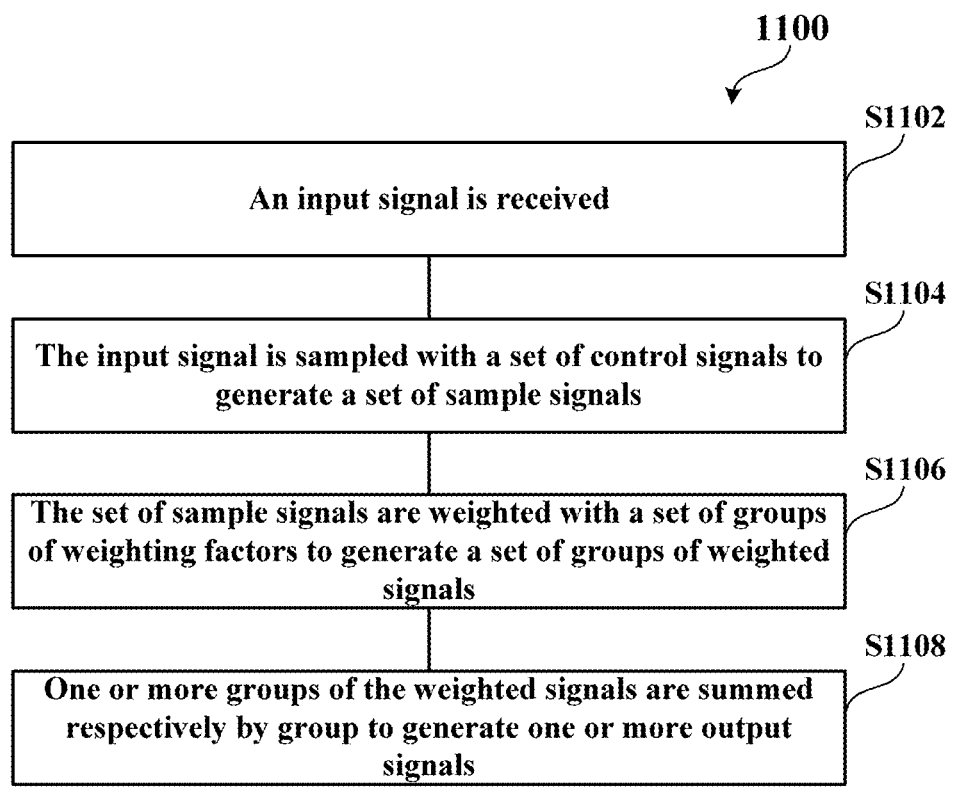
FIG. 11 shows a tuning method 1100 according to an embodiment of the application.

FIG. 11 illustrates a signal tuning method 1100 according to an embodiment of the application. The signal tuning method 1100 may be implemented by the tuner 900 shown in FIG. 9 or the tuner 1000 shown in FIG. 10.

As shown in FIG. 11, the signal tuning method 1100 includes the following steps.

In step S1102, an input signal is received.

In step S1104, the input signal is sampled with a set of control signals to generate a set of sample signals, wherein each of the set of control signals has a control period equal to ($N*T_{VCO}$), and the control periods of the set of control signals synchronize with each other.

In step S1106, the set of sample signals are weighted with a set of groups of weighting factors to generate a set of groups of weighted signals.

In step S1108, one or more groups of the weighted signals are summed by group respectively to generate one or more tuned signals, wherein each of the output signals has a predefined frequency shift of $f_{VCO}*m_k/N$ compared with the input signal, wherein 0<$m_k$<N/2, $m_k$ is an integer, k is the group sequence number of a k-th group of weighting factors of the set of weighting factors and $f_{VCO}=1/T_{VCO}$.

In some embodiments, step S1106 further includes: for each weighting factor of a group of weighting factors, weighting one of the set of sample signals with the weighting factor to generate a weighted signal, thereby generating a group of weighted signal signals corresponding to the group of weighting factors.

In some embodiments, the step S1108 further includes: outputting the one or more tuned signals in voltage form.

In some embodiments, the step S1108 further includes: filtering out signals which are out of the frequency ranges of the output signals with a filter.

In some embodiments, the signal tuning method 1100 further includes: selecting one group of weighted signals from the set of groups of weighted signals for summing.

In some embodiments, the control period comprises N successive control intervals, the N successive control intervals have an equal time period $T_{VCO}$, and wherein each of the set of control signals controls the sampling of the input signal in one of the N sampling control intervals respectively.

Those skilled in the art may understand and implement other variations to the disclosed embodiments from a study of the drawings, the disclosure, and the appended claims. In the claims, the word "comprising" does not exclude other elements or steps, and the indefinite article "a" or "an" does not exclude a plurality. In applications according to present application, one element may perform functions of several technical feature recited in claims. Any reference signs in the claims should not be construed as limiting the scope.

What is claimed is:

1. A tuner, comprising:
a sampling module comprising a set of sampling units, each sampling unit being configured to receive an input signal and a control signal, sample the input signal under the control of the control signal and generate a sample signal; wherein each of the set of control signals received by the set of sampling units has a control period equal to $(N*T_{VCO})$, N is an integer, $T_{VCO}$ denotes a period of a voltage control oscillating signal, and the control periods of the set of control signals synchronize with each other;
at least two weighting modules coupled to the sampling module, each weighting module being configured to receive the set of sample signals and weight the received sample signals with a group of weighting factors to generate a group of weighted signals; and
at least two summing modules, each summing module being configured to receive one group of weighted signals generated by one of the at least two weighting modules and sum the group of weighted signals to output an output signal, wherein the output signal has a predefined frequency shift of $f_{VCO}*m_k/N$ compared with the input signal, and wherein $0<m_k<N/2$, $m_k$ is an integer, k is the sequence number of the weighting module and $f_{VCO}=1/T_{VCO}$;
wherein two or more of the at least two weighting modules have different groups of weighting factors such that two or more output signals outputted by the at least two summing modules have different frequency shifts compared with the input signal.

2. The tuner of claim 1, wherein the tuner further comprises a selection module configured to select one or more weighting modules from the at least two weighting modules so as to provide one or more groups of weighted signals generated by the selected one or more weighting modules to the one or more summing modules.

3. The tuner of claim 1, wherein the control period comprises N successive control intervals, the N successive control intervals have equal time period $T_{VCO}$, and wherein each group of weighted signals are configured such that in each control interval $T_n$, the amplitude of the output signal is $\beta_{k,n}$ times the amplitude of the input signal, where $$\beta_{k,n} = A\cos\left(2\pi m_k \cdot \frac{n-1}{N} + \theta\right) + B \text{ or}$$

$$\beta_{k,n} = A\sin\left(2\pi m_k \cdot \frac{n-1}{N} + \theta\right) + B,$$

n=1, 2, . . . ,N, and A, B and B are predefined real numbers.

4. The tuner of claim 3, wherein both the number of the set of sampling units and the number of weighting factors included in each group of weighting factors are equal to M, which is equal to or greater than N, and wherein in each control period, the set of control signals correspond to a sampling control matrix $$C = \begin{bmatrix} c_{11} & c_{12} & \cdots & c_{1,M} \\ c_{21} & c_{22} & \cdots & c_{2,M} \\ \vdots & \vdots & c_{i,j} & \vdots \\ c_{N,1} & \cdots & \cdots & c_{N,M} \end{bmatrix},$$

wherein $c_{i,j}$ represents a sampling indicator of the j-th control signal in the i-th sampling control interval, and the group of weighting factors is represented by a weighting factor vector $\alpha_k=[\alpha_{k,1}, \alpha_{k,2}, \ldots, \alpha_{k,M}]^T$, where $\alpha_{k,i}$ is the i-th weighting factor that satisfies an equation $C\alpha_k=\beta_k$ and wherein $\beta_k=[\beta_{k,1}, \beta_{k,2}, \ldots, \beta_{k,N}]^T$.

5. The tuner of claim 4, wherein the number of the set of sampling units M is equal to N.

6. The tuner of claim 5, wherein the sampling control matrix C is an identity matrix.

7. The tuner of claim 4, wherein the number of the set of sampling units M is greater than N.

8. The tuner of claim 1, wherein each weighting module comprises a group of weighting units, and wherein each of the group of weighting units is configured to receive one of the set of sample signals and weight the received sample signal with one of a group of weighting factors.

9. The tuner of claim 1, wherein each of the summing modules comprises a trans-impendence amplifier (TIA), and the TIA is such configured that the group of weighted signals received by the summing module is summed at an input node of the summing module and the summing module outputs the output signal in voltage form.

10. The tuner of claim 1, wherein each of the at least two summing modules comprises a filter, and the filter is configured to filter out signals which are out of the frequency range of the output signal generated by the summing module.

11. The tuner of claim 1, wherein the control period comprises N successive control intervals, and the N successive control intervals have an equal time period $T_{VCO}$, and wherein each of the set of control signals controls the sampling module to sample the input signal in one of the N sampling control intervals respectively.

12. A method for tuning a signal, comprising:
receiving an input signal;
sampling the input signal with a set of control signals to generate a set of sample signals, wherein each of the set of control signals has a control period equal to $(N*T_{VCO})$, N is an integer, $T_{VCO}$ denotes a period of a voltage control oscillating signal, and the control periods of the set of control signals synchronize with each other;

weighting the set of sample signals with at least two groups of weighting factors to generate at least two groups of weighted signals; and summing one or more groups of the at least two groups of weighted signals by group to output one or more tuned signals respectively, the output signal having a predefined frequency shift of $f_{VCO}*m_k/N$ compared with the input signal, wherein $0<m_k<N/2$, $m_k$ is an integer, k is the group sequence number of a k-th group of weighting factors of the at least two groups of weighting factors and $f_{VCO}=1/T_{VCO}$;

wherein the weighting step comprises:

weighting the set of sample signals with at least two different groups of weighting factors to generate at least two different groups of weighted signals, such that two or more output signals summed from the at least two groups of weighted signals have different frequency shifts compared with the input signal.

13. The method of claim 12, further comprising:

selecting one or more groups from the at least two groups of weighted signals and summing the selected one or more groups of weighted signals by group respectively.

14. The method of claim 12, wherein the control period comprises N successive control intervals, the N successive control intervals have an equal time period $T_{VCO}$, and wherein each group of weighted signals are configured such that in each control interval $T_n$, the amplitude of the output signal is $\beta_{k,n}$ times the amplitude of the input signal, where $$\beta_{k,n} = A\cos\left(2\pi m_k \cdot \frac{n-1}{N} + \theta\right) + B \text{ or}$$

$$\beta_{k,n} = A\sin\left(2\pi m_k \cdot \frac{n-1}{N} + \theta\right) + B,$$

n=1, 2, ..., N, and A, B and θ are predefined real numbers.

15. The method of claim 14, wherein both the number of the set of sample signals and the number of weighting factors included in each group of weighting factors are equal to M, which is equal to or greater than N, and wherein in each control period, the set of control signals correspond to a sampling control matrix $$C = \begin{bmatrix} c_{11} & c_{12} & \cdots & c_{1,M} \\ c_{21} & c_{22} & \cdots & c_{2,M} \\ \vdots & \vdots & c_{i,j} & \vdots \\ c_{N,1} & \cdots & \cdots & c_{N,M} \end{bmatrix},$$

wherein $c_{i,j}$ represents a sampling indicator of the j-th control signal in the i-th sampling control interval, and the group of weighting factors is represented by a weighting factor vector $\alpha_k=[\alpha_{k,1}, \alpha_{k,2}, \ldots, \alpha_{k,M}]^T$, where $\alpha_{k,i}$ is the i-th weighting factor that satisfies an equation $C\alpha_k=\beta_k$ and wherein $\beta_k=[\beta_{k,1}, \beta_{k,2}, \ldots, \beta_{k,N}]^T$.

16. The method of claim 15, wherein the number of the set of sample signals M is equal to N.

17. The method of claim 16, wherein the sampling control matrix C is an identity matrix.

18. The method of claim 15, wherein the number of the set of sample signals M is greater than N.

19. The method of claim 12, wherein weighting the set of sample signals with the at least two groups of weighting factors to generate the at least two groups of weighted signals comprises:

for each weighting factor of a group of weighting factors, weighting one of the set of sample signals with the weighting factor to generate a weighted signal, thereby generating a group of weighted signal signals corresponding to the group of weighting factors.

20. The method of claim 12, wherein the one or more tuned signals are in voltage form.

21. The method of claim 12, wherein summing one or more groups of the at least two groups of weighted signals by group to output one or more tuned signals comprises:

filtering out signals which are out of the frequency ranges of the output signals with a filter.

22. The method of claim 12, wherein summing one or more groups of the at least two groups of weighted signals by group comprises summing one group of the weighted signals, the method further comprises:

selecting one group of the at least two groups of weighted signals from the at least two groups of weighted signals.

23. The method of claim 12, wherein the control period comprises N successive control intervals, the N successive control intervals have an equal time period $T_{VCO}$, and wherein each of the set of control signals controls the sampling of the input signal in one of the N sampling control intervals respectively.

24. A tuner, comprising:

a sampling module comprising a set of sampling units, each sampling unit being configured to receive an input signal and a control signal, sample the input signal under the control of the control signal and generate a sample signal; wherein each of the set of control signals received by the set of sampling units has a control period equal to $(N*T_{VCO})$, N is an integer, $T_{VCO}$ denotes a period of a voltage control oscillating signal, and the control periods of the set of control signals synchronize with each other;

at least two weighting modules coupled to the sampling module, each weighting module being configured to receive the set of sample signals and weight the received sample signals with a group of weighting factors to generate a group of weighted signals;

a summing module configured to receive one group of weighted signals generated by one of the at least two weighting modules and sum the group of weighted signals to output an output signal, wherein the output signal has a predefined frequency shift of $f_{VCO}*m_k/N$ compared with the input signal, and wherein $0<m_k<N/2$, $m_k$ is an integer, k is the sequence number of the weighting module and $f_{VCO}=1/T_{VCO}$; and a selection module configured to select one of the groups of weighted signals generated by the at least two weighting modules and provide the selected group of weighted signals to the summing module.

* * * * *